US012765238B2

(12) United States Patent
Zhao et al.

(10) Patent No.: US 12,765,238 B2
(45) Date of Patent: Oct. 13, 2026

(54) ARRAY SUBSTRATE AND DISPLAY DEVICE

(71) Applicant: Wuhan China Star Optoelectronics Semiconductor Display Technology Co., Ltd., Wuhan (CN)

(72) Inventors: Huihui Zhao, Wuhan (CN); Jiaqing He, Wuhan (CN)

(73) Assignee: Wuhan China Star Optoelectronics Semiconductor Display Technology Co., Ltd, Wuhan (CN)

( * ) Notice: Subject to any disclaimer, the term of this patent is extended or adjusted under 35 U.S.C. 154(b) by 902 days.

(21) Appl. No.: 16/646,157

(22) PCT Filed: Jan. 13, 2020

(86) PCT No.: PCT/CN2020/071646
§ 371 (c)(1),
(2) Date: Aug. 7, 2023

(87) PCT Pub. No.: WO2021/036176
PCT Pub. Date: Mar. 4, 2021

(65) Prior Publication Data

US 2025/0351708 A1 Nov. 13, 2025

(30) Foreign Application Priority Data

Aug. 30, 2019 (CN) ........................ 201910813497.1

(51) Int. Cl.
*H10K 59/80* (2023.01)
*H10D 86/40* (2025.01)
*H10D 86/60* (2025.01)
*H10K 59/124* (2023.01)

(52) U.S. Cl.
CPC ......... *H10K 59/874* (2023.02); *H10D 86/451* (2025.01); *H10D 86/60* (2025.01); *H10K 59/124* (2023.02)

(58) Field of Classification Search
CPC .... H10K 59/874; H10K 59/124; H10D 86/60; H10D 86/451
See application file for complete search history.

(56) References Cited

U.S. PATENT DOCUMENTS

2002/0150683 A1* 10/2002 Troian ................ B01F 33/3021 137/828
2013/0329274 A1* 12/2013 Yang .................... G02B 26/005 359/290
2015/0303393 A1 10/2015 Dai et al.
(Continued)

FOREIGN PATENT DOCUMENTS

CN 103187434 A 7/2013
CN 107302012 A 10/2017
CN 107910334 A 4/2018
(Continued)

*Primary Examiner* — Vongsavanh Sengdara
(74) *Attorney, Agent, or Firm* — PV IP PC; Peter Stecher; Wei Te Chung

(57) ABSTRACT

The present disclosure provides an array substrate and a display device. The array substrate includes a substrate layer, a functional structure layer, a passivation layer, and an organic planarization layer. The functional structure layer has an organic filling layer, and the passivation layer is disposed between the organic filling layer and the organic planarization layer.

8 Claims, 1 Drawing Sheet

(56) References Cited

U.S. PATENT DOCUMENTS

| | | | | |
|---|---|---|---|---|
| 2018/0033841 | A1* | 2/2018 | Yang | H10K 59/873 |
| 2019/0164998 | A1* | 5/2019 | Cho | H10D 86/423 |

FOREIGN PATENT DOCUMENTS

| | | | |
|---|---|---|---|
| CN | 109166880 | A | 1/2019 |
| CN | 109638050 | A | 4/2019 |
| CN | 109671719 | A | 4/2019 |
| CN | 109950277 | A | 6/2019 |
| CN | 110112142 | A | 8/2019 |
| CN | 110610948 | A | 12/2019 |

* cited by examiner

ARRAY SUBSTRATE AND DISPLAY DEVICE

The present application claims priority of the Chinese patent application No. 201910813497.1 filed on Aug. 30, 2019 with the National Intellectual Property Administration, titled "Array substrate and display device", which is incorporated by reference in the present application in its entirety.

TECHNICAL FIELD

The present disclosure relates to the field of display technologies, and more particularly, to an array substrate and a display device.

BACKGROUND

Organic light-emitting diodes (OLEDs) are a new developing tablet display technology. Display methods of OLED display technology are different from conventional LCD display methods, wherein the display methods of OLED display technology need no backlights and use a very thin organic material coated layer and a glass substrate, and the organic material will emit light when a current passes. Because OLEDs have advantages of having simple manufacturing process, low cost, low power consumptions, high luminous brightness, moderate and wide ranges of working temperatures, lightness, thinness, and fast response times, as well as easiness to achieve color displays and large screen displays, match with an IC driver, and achieve flexible displays, they have broad application prospects.

With rapid development of OLED technology, requirements for flexible and bendable display screens are getting higher. Because inorganic films and metal film layers in thin film transistors (TFTs) have worse bending resistance, products will have cracks when bending inward or outward, which causes poor product performance. Because organic materials have a low Young's modulus and good flexibility, based on this, organic deep hole material technology (ODH) is developed. That is opening a hole in inorganic film layers and using an organic material having a low Young's modulus to fill in the hole, and hence, an existence of organic layers greatly increases bending resistance of products.

In current TFT substrate structures, a layer of metal film is disposed on an ODH film layer, and a layer of organic material covers the metal film layer as a planarization (PLN) layer. Affected by a drying process of source/drain electrodes, a surface of the ODH film layer will form C—F bonds and becomes hydrophobic. However, a wet film of the PLN film layer is hydrophilic, so it is difficult for the PLN film layer to attach onto the ODH film layer, thereby causing the PLN film layer to fall off. The abnormal incidence rate is up to 100%, and display devices having the problem can only be scrapped, which seriously affects product yield.

SUMMARY

Technical Problem

Technical problem: an objective of the present disclosure is to provide an array substrate and a display device to solve problems of poor adhesion between an organic filling film layer and a planarization layer, which causes the planarization layer to fall off and increases scrap rate of display devices and low yield in current technology.

Solution to Problem

Technical Solution

To achieve the above objectives, the present disclosure provides an array substrate. The array substrate comprises a substrate layer, a functional structure layer, a passivation layer, and an organic planarization layer.

The functional structure layer is disposed on the substrate layer. The functional structure layer has an organic filling layer, and a material of the organic filling layer is organics. The passivation layer is disposed on the organic filling layer of the functional structure layer. The passivation layer has hydrophilic substances or groups and/or hydrophobic substances or groups. One or more passivation layers can be disposed in the array substrate. The organic planarization layer is disposed on a surface of the passivation layer away from the functional structure layer.

Further, the functional structure layer further comprises a barrier layer, a buffer layer, an active layer, a first insulating layer, a first gate electrode layer, a second insulating layer, a second gate electrode layer, a dielectric layer, and a source/drain electrode layer.

The barrier layer is disposed on the substrate layer. The buffer layer is disposed on the barrier layer. The active layer is disposed on the buffer layer. The first insulating layer is disposed on the active layer and the buffer layer. The first gate electrode layer is disposed on the first insulating layer. The second insulating layer is disposed on the first gate electrode layer and the first insulating layer. The second gate electrode layer is disposed on the second insulating layer. The dielectric layer is disposed on the second gate electrode layer and the second insulating layer. The source/drain electrode layer is disposed on the dielectric layer and penetrates through the dielectric layer, the second insulating layer, and the first insulating layer to connect to two ends of the active layer. Wherein, the organic filling layer is disposed between the dielectric layer and the source/drain electrode layer.

Further, the organic filling layer has an extending part and a vertical part. The extending part covers the dielectric layer. The vertical part is perpendicularly connected to the extending part and penetrates through the dielectric layer, the second insulating layer, the first insulating layer, the buffer layer, and a portion of the barrier layer.

Further, the array substrate has a functional area and a non-functional area surrounding the functional area. The extending part of the organic filling layer is disposed in the non-functional area, and the active layer, the first gate electrode layer, the second gate electrode layer, and the source/drain electrode layer are disposed in the functional area.

Further, when the passivation layer is a single-layered structure, the passivation layer has hydrophilic substances or groups.

Further, when the passivation layer is a double-layered structure, one layer of the passivation layer adjacent to the organic filling layer has hydrophilic substances or groups, and another layer of the passivation layer adjacent to the organic planarization layer has hydrophobic substances or groups.

Further, a material of the passivation layer is one or more of inorganics or organics with hydrophilic bonds.

Further, the inorganics is one or more of silicon nitride, silicon oxide, monocrystalline silicon, germanium, or zirconium oxide. The organics is one or more of organics with a carboxyl group or organics with a hydroxyl group.

Further, the active layer has a doped area correspondingly disposed at the two ends of the active layer, and the source/drain electrode layer is connected to the doped area.

The present disclosure further provides a display device which comprises the above array substrate.

Beneficial Effect of Invention

Beneficial Effect

Advantages of the present disclosure is that:

in an array substrate of the present disclosure, adhesion between an organic filling layer and an organic planarization layer can be improved, the organic planarization layer can be prevented from falling off, scrap rate can be decreased, and yield can be increased by disposing one-layered or multi-layered passivation layer which consists of inorganics or organics having hydrophilic groups between the organic filling layer and the organic planarization layer.

BRIEF DESCRIPTION OF DRAWINGS

Description of Drawings

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

Figure 1:
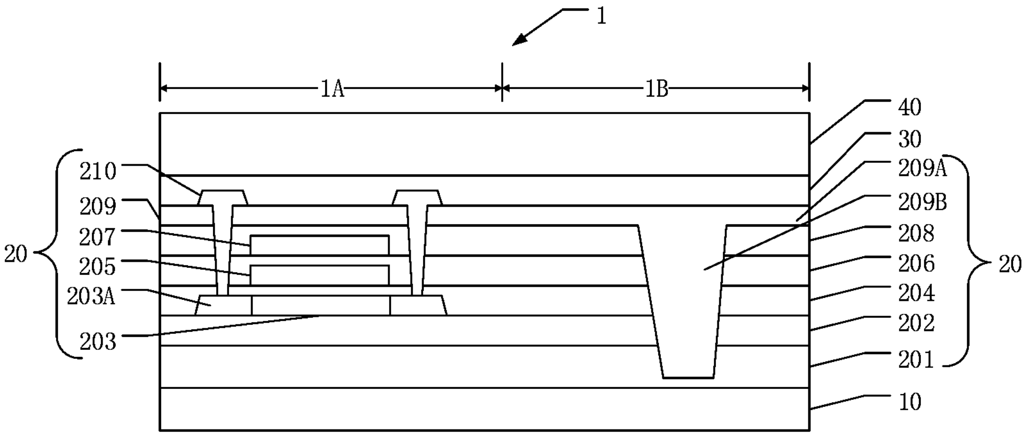

FIG. 1 is a schematic layered diagram of an array substrate according to embodiment 1 of the present disclosure.

Figure 2:
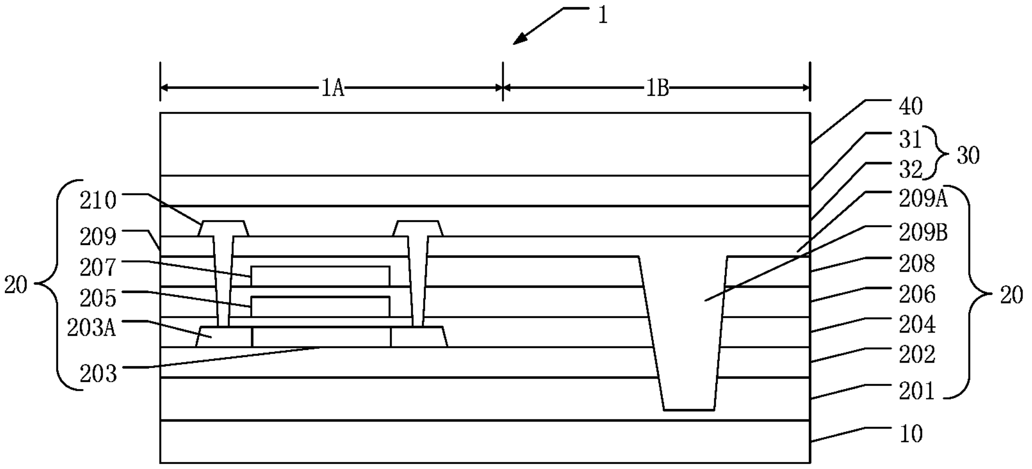

FIG. 2 is a schematic layered diagram of an array substrate according to embodiment 2 of the present disclosure.

Elements in the drawings are designated by reference numerals listed below:

array substrate 1;
functional area 1A; non-functional area 1B;
substrate layer 10; functional structure layer 20;
barrier layer 201; buffer layer 202;
active layer 203; doped area 203A;
first insulating layer 204; first gate electrode layer 205;
second insulating layer 206; second gate electrode layer 207;
dielectric layer 208; organic filling layer 209;
extending part 209A; vertical part 209B;
source/drain electrode layer 210; passivation layer 30;
upper passivation layer 31; lower passivation layer 32;
organic planarization layer 40.

EXAMPLES

Detailed Description of Embodiments

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown, and the present disclosure does not limit the size and thickness of each component. In order to make the drawings clearer, thicknesses of some components in the drawings are appropriately exaggerated.

Besides, the specific embodiments described with reference to the attached drawings are all exemplary and are intended to illustrate and interpret the present disclosure. In the description of the present disclosure, it should be understood that terms such as “upper”, “lower”, “front”, “rear”, “left”, “right”, “inside”, “outside”, “side”, as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as “first” and “second” are used herein for purposes of description and are not intended to indicate or imply relative importance.

When a component is described as “on” another component, the component can be placed directly on the other component; an intermediate component can also exist, the component is placed on the intermediate component, and the intermediate component is placed on another component. When a component is described as “installed to” or “connected to” another component, it can be understood as directly “installed to” or “connected to”, or a component is “mounted to” or “connected to” another component through an intermediate component.

Embodiment 1

An embodiment of the present disclosure provides an array substrate 1, as shown in FIG. 1. The array substrate 1 has a functional area 1A and a non-functional area 1B surrounding the functional area 1A. The array substrate 1 further comprises a substrate layer 10, a functional structure layer 20, a passivation layer 30, and an organic planarization layer 40.

The substrate layer 10 is a flexible substrate layer 10 and is made of polyimide (PI). The substrate layer 10 is used to protect entire structure of the array substrate 1 and can achieve flexible and bendable display.

The functional structure layer 20 is disposed on the substrate layer 10, Wherein, the functional structure layer 20 comprises a barrier layer 201, a buffer layer 202, an active layer 203, a first insulating layer 204, a first gate electrode layer 205, a second insulating layer 206, a second gate electrode layer 207, a dielectric layer 208, a source/drain electrode layer 210, and an organic filling layer 209.

The barrier layer 201 is disposed on the substrate layer 10 and is used to isolate water and oxygen to prevent devices in the functional structure layer 20 from corrosion of water and oxygen. The buffer layer 202 is disposed on the barrier layer 201 and is used to reduce impact of vibrations on the devices in the functional structure layer 20 during movement to protect the functional structure layer 20 and the entire structure of the array substrate 1. The active layer 203 is disposed on a surface of the buffer layer 202 away from the barrier layer 201 and consists of polysilicon, monocrystalline silicon, etc. Two ends of the active layer 203 are provided with a doped area 203A, and the doped area 203A can be formed by ion implantation, etc. The first insulating layer 204 covers the active layer 203 and the buffer layer 202. The first insulating layer 204 is used to protect the active layer 203 and to insulate the active layer 203 from the first gate electrode layer 205. The first gate electrode layer 205 is disposed on a surface of the first insulating layer 204 away from the active layer 203 and corresponds to the active layer 203. The second insulating layer 206 covers the first gate electrode layer 205 and the first insulating layer 204. The second insulating layer 206 is used to protect the first gate electrode layer 205 and to insulate the first gate electrode layer 205 from the second gate electrode layer 207. The second gate electrode layer 207 is disposed on a surface of the second insulating layer 206 away from the first gate electrode layer 205 and the second insulating layer 206 also corresponds to the active layer 203. The dielectric layer 208 is disposed on the second gate electrode layer 207 and the second insulating layer 206 and is used to insulate and protect the second gate electrode layer 207. The source/drain electrode layer 210 is disposed on the dielectric layer 208 and penetrates through the dielectric layer 208, the second insulating layer 206, and the first insulating layer 204 to connect to the doped area 203A at two ends of the active layer 203.

The organic filling layer 209 is disposed between the dielectric layer 208 and the source/drain electrode layer 210 and has an extending part 209A and a vertical part 209B. The extending part 209A covers a surface of the dielectric layer 208 away from the second gate electrode layer 207, and the vertical part 209B is perpendicularly connected to a surface of the extending part 209A toward the dielectric layer 208 and penetrates through the dielectric layer 208, the second insulating layer 206, the first insulating layer 204, the buffer layer 202, and a portion of the barrier layer 201 in sequence. The organic filling layer 209 is used to adjust stresses among upper and lower film layers of the functional structure layer 20 and to disperse the stresses of the functional structure layer 20 when bending, which is beneficial for bending the source/drain electrode layer 210 and prevents wirings of the source/drain electrode layer 210 from being damaged by bending.

Wherein, the active layer 203, the first gate electrode layer 205, the second gate electrode layer 207, and the source/drain electrode layer 210 are correspondingly disposed in the functional area 1A, and the vertical part 209B of the organic filling layer 209 is correspondingly disposed in the non-functional area 1B.

The barrier layer 201 can be manufactured by inorganic materials and may be manufactured by a material containing silicon, nitrogen, and oxygen elements. The first gate electrode layer 205, the second gate electrode layer 207, and the source/drain electrode layer 210 can be a metal or an alloy containing copper, titanium, molybdenum, etc., which has excellent conductivity. A material of the first insulating layer 204, the second insulating layer 206, and the dielectric layer 208 may be silicon oxide, silicon nitride, or silicon oxynitride. The organic filling layer 209 consists of an organic material.

The functional structure layer 20 can generate an electrical field by applying a voltage to the first gate electrode layer 205 and the second gate electrode layer 207. The electric field will induce induced charges generated on a surface of the active layer 203 to change a thickness of a conductive channel, thereby controlling a current of the source/drain electrode layer 210 and driving each display pixel in a display device.

The organic planarization layer 40 covers the source/drain electrode of the functional structure layer 20 and the organic filling layer 209, and is manufactured by an organic material. The organic planarization layer 40 is used to flatten a surface of the array substrate 1.

The passivation layer 30 is disposed between the organic planarization layer 40 and the organic filling layer 209, and may be manufactured by chemical deposition, atomic layer deposition, sol-gel, etc. The passivation layer 30 consists of a material having hydrophobic substances or groups, for example, inorganic materials, such as silicon nitride, silicon oxide, monocrystalline silicon, germanium, and zirconium oxide; or organic materials having hydrophilic groups like carboxyl groups or hydroxyl groups, such as polyimide containing carboxyl groups or hydroxyl groups, epoxy resins having branched carboxyl groups, polyacrylic acid, poly(lactic-co-glycolic acid) copolymer, and polyethylene terephthalate. A thickness of the passivation layer 30 ranges from 0.1 nm to 1000000 nm. The passivation layer 30 can improve attachment between the organic filling layer 209 and the organic planarization layer 40 to prevent the organic planarization layer 40 from falling off.

An embodiment of the present disclosure further provides a display device. The display device comprises the above array substrate 1, and the display device is an OLED display device. The display device may be any products or components having display function, such as a cell phone, a tablet, or a laptop.

The array substrate 1 provided by the embodiment of the present disclosure can improve adhesion between an organic filling layer 209 and an organic planarization layer 40 to prevent the organic planarization layer 40 from falling off, thereby increasing yield of the array substrate 1, increasing service life of products at the same time, and improving user experiences by disposing a passivation layer 30 consisting of an inorganic material or an organic material having hydrophilic groups.

Embodiment 2

An embodiment of the present disclosure provides an array substrate 1, as shown in FIG. 1. The array substrate 1 has a functional area 1A and a non-functional area 1B surrounding the functional area 1A. The array substrate 1 further comprises a substrate layer 10, a functional structure layer 20, a passivation layer 30, and an organic planarization layer 40.

The substrate layer 10 is a flexible substrate layer 10 and is made of polyimide (PI). The substrate layer 10 is used to protect entire structure of the array substrate 1 and can achieve flexible and bendable display.

The functional structure layer 20 is disposed on the substrate layer 10, Wherein, the functional structure layer 20 comprises a barrier layer 201, a buffer layer 202, an active layer 203, a first insulating layer 204, a first gate electrode layer 205, a second insulating layer 206, a second gate electrode layer 207, a dielectric layer 208, a source/drain electrode layer 210, and an organic filling layer 209.

The barrier layer 201 is disposed on the substrate layer 10 and is used to isolate water and oxygen to prevent devices in the functional structure layer 20 from corrosion of water and oxygen. The buffer layer 202 is disposed on the barrier layer 201 and is used to reduce impact of vibrations on the devices in the functional structure layer 20 during movement to protect the functional structure layer 20 and the entire structure of the array substrate 1. The active layer 203 is disposed on a surface of the buffer layer 202 away from the barrier layer 201 and consists of polysilicon, monocrystalline silicon, etc. Two ends of the active layer 203 are provided with a doped area 203A, and the doped area 203A can be formed by ion Implantation, etc. The first insulating layer 204 covers the active layer 203 and the buffer layer 202. The first insulating layer 204 is used to protect the active layer 203 and to insulate the active layer 203 from the first gate electrode layer 205. The first insulating layer 204 covers the active layer 203 and the buffer layer 202. The first insulating layer 204 is used to protect the active layer 203 and to insulate the active layer 203 from the first gate electrode layer 205. The first gate electrode layer 205 is disposed on a surface of the first insulating layer 204 away from the active layer 203 and corresponds to the active layer 203. The second insulating layer 206 covers the first gate electrode layer 205 and the first insulating layer 204. The second insulating layer 206 is used to protect the first gate electrode layer 205 and to insulate the first gate electrode layer 205 from the second gate electrode layer 207. The second gate electrode layer 207 is disposed on a surface of the second insulating layer 206 away from the first gate electrode layer 205 and the second insulating layer 206 also corresponds to the active layer 203. The dielectric layer 208 is disposed on the second gate electrode layer 207 and the second insulating layer 206 and is used to insulate and protect the second gate electrode layer 207. The source/drain electrode layer 210 is disposed on the dielectric layer 208 and penetrates through the dielectric layer 208, the second insulating layer 206, and the first insulating layer 204 to connect to the doped area 203A at two ends of the active layer 203.

The organic filling layer 209 is disposed between the dielectric layer 208 and the source/drain electrode layer 210 and has an extending part 209A and a vertical part 209B. The extending part 209A covers a surface of the dielectric layer 208 away from the second gate electrode layer 207, and the vertical part 209B is perpendicularly connected to a surface of the extending part 209A toward the dielectric layer 208 and penetrates through the dielectric layer 208, the second insulating layer 206, the first insulating layer 204, the buffer layer 202, and a portion of the barrier layer 201 in sequence. The organic filling layer 209 is used to adjust stresses among upper and lower film layers of the functional structure layer 20 and to disperse the stresses of the functional structure layer 20 when bending, which is beneficial for bending the source/drain electrode layer 210 and prevents wirings of the source/drain electrode layer 210 from being damaged by bending.

Wherein, the active layer 203, the first gate electrode layer 205, the second gate electrode layer 207, and the source/drain electrode layer 210 are correspondingly disposed in the functional area 1A, and the vertical part 209B of the organic filling layer 209 is correspondingly disposed in the non-functional area 1B.

The barrier layer 201 can be manufactured by inorganic materials and may be manufactured by a material containing silicon, nitrogen, and oxygen elements. The first gate electrode layer 205, the second gate electrode layer 207, and the source/drain electrode layer 210 can be a metal or an alloy containing copper, titanium, molybdenum, etc., which has excellent conductivity. A material of the first insulating layer 204, the second insulating layer 206, and the dielectric layer 208 may be silicon oxide, silicon nitride, or silicon oxynitride. The organic filling layer 209 consists of an organic material.

The functional structure layer 20 can generate an electrical field by applying a voltage to the first gate electrode layer 205 and the second gate electrode layer 207. The electric field will induce induced charges generated on a surface of the active layer 203 to change a thickness of a conductive channel, thereby controlling a current of the source/drain electrode layer 210 and driving each display pixel in a display device.

The organic planarization layer 40 covers the source/drain electrode of the functional structure layer 20 and the organic filling layer 209, and is manufactured by an organic material. The organic planarization layer 40 is used to flatten a surface of the array substrate 1.

The passivation layer 30 is disposed between the organic planarization layer 40 and the organic filling layer 209, and may be manufactured by chemical deposition, atomic layer deposition, sol-gel, etc. The passivation layer 30 comprises an upper passivation layer 31 and a lower passivation layer 32. Wherein, the upper passivation layer 31 is disposed on one side of the passivation layer 30 adjacent to the organic planarization layer 40 and consists of an inorganic material having hydrophobic substances or groups, such as silicon nitride, silicon oxide, monocrystalline silicon, germanium, and zirconium oxide, and the lower passivation layer 32 is disposed on one side of the passivation layer 30 adjacent to the organic filling layer 209 and consists of an organic material having hydrophilic groups like carboxyl groups or hydroxyl groups, such as polyimide containing carboxyl groups or hydroxyl groups, epoxy resins having branched carboxyl groups, polyacrylic acid, poly(lactic-co-glycolic acid) copolymer, and polyethylene terephthalate. An overall thickness of the upper passivation layer 31 and the lower passivation layer 32 ranges from 0.1 nm to 1000000 nm. The passivation layer 30 can improve attachment between the organic filling layer 209 and the organic planarization layer 40 to prevent the organic planarization layer 40 from falling off.

An embodiment of the present disclosure further provides a display device. The display device comprises the above array substrate 1, and the display device is an OLED display device. The display device may be any products or components having display function, such as a cell phone, a tablet, or a laptop.

The array substrate 1 provided by the embodiment of the present disclosure can improve adhesion between an organic filling layer 209 and an organic planarization layer 40 to prevent the organic planarization layer 40 to fall off, thereby increasing yield of the array substrate 1, increasing service life of products at the same time, and improving user experiences by disposing a passivation layer 30 consisting of an inorganic material or an organic material having hydrophilic groups.

A single-layered passivation layer 30 and a double-layered passivation layer 30 are individually provided in embodiment 1 and embodiment 2, but the passivation layer 30 may be a three-layered, four-layered, or multi-layered structure in other embodiments of the present disclosure. In addition, structures of other devices in the array substrate 1 are similar to those provided in embodiment 1 and embodiment 2, so they are not repeated herein. Based on the embodiments in the present disclosure, all other embodiments obtained by those skilled in the art without creative efforts are within the scope of the present disclosure.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims. It should be understood that the different dependent claims and the features described herein may be combined in a manner different from that described in the original claims. It should also be appreciated that features described in connection with the individual embodiments can be used in other described embodiments.

What is claimed is:

1. An array substrate, comprising:

a substrate layer;

a functional structure layer disposed on the substrate layer and having an organic filling layer;

at least one passivation layer disposed on the organic filling layer of the functional structure layer and having hydrophilic substances or groups and/or hydrophobic substances or groups; and an organic planarization layer disposed on a surface of the passivation layer away from the functional structure layer;

wherein the passivation layer is a double-layered structure, one layer of the passivation layer adjacent to the organic filling layer has hydrophilic substances or groups, and another layer of the passivation layer adjacent to the organic planarization layer has hydrophobic substances or groups.

2. The array substrate according to claim 1, wherein the functional structure layer further comprises:

a barrier layer disposed on the substrate layer;

a buffer layer disposed on the barrier layer;

an active layer disposed on the buffer layer;

a first insulating layer disposed on the active layer and the buffer layer;

a first gate electrode layer disposed on the first insulating layer;

a second insulating layer disposed on the first gate electrode layer and the first insulating layer;

a second gate electrode layer disposed on the second insulating layer;

a dielectric layer disposed on the second gate electrode layer and the second insulating layer; and a source/drain electrode layer disposed on the dielectric layer and penetrating through the dielectric layer, the second insulating layer, and the first insulating layer to connect to two ends of the active layer;

wherein the organic filling layer is disposed between the dielectric layer and the source/drain electrode layer.

3. The array substrate according to claim 2, wherein the organic filling layer has an extending part and a vertical part, the extending part covers the dielectric layer, and the vertical part is perpendicularly connected to the extending part and penetrates through the dielectric layer, the second insulating layer, the first insulating layer, the buffer layer, and a portion of the barrier layer.

4. The array substrate according to claim 3, comprising a functional area and a non-functional area surrounding the functional area, wherein the extending part of the organic filling layer is disposed in the non-functional area, and the active layer, the first gate electrode layer, the second gate electrode layer, and the source/drain electrode layer are disposed in the functional area.

5. The array substrate according to claim 2, wherein the active layer has a doped area correspondingly disposed at the two ends of the active layer, and the source/drain electrode layer is connected to the doped area.

6. The array substrate according to claim 1, wherein a material of the passivation layer is one or more of inorganics or organics with hydrophilic bonds.

7. The array substrate according to claim 6, wherein the inorganics is one or more of silicon nitride, silicon oxide, monocrystalline silicon, germanium, or zirconium oxide, and the organics is one or more of organics with a carboxyl group or organics with a hydroxyl group.

8. A display device, comprising the array substrate according to claim 1.

* * * * *